(12) United States Patent
Landt

(10) Patent No.: US 7,956,314 B1
(45) Date of Patent: Jun. 7, 2011

(54) MICROWAVE SWITCHING ELEMENT

(75) Inventor: Don L. Landt, Palo, IA (US)

(73) Assignee: Rockwell Collins, Inc., Cedar Rapids, IA (US)

(*) Notice: Subject to any disclaimer, the term of this patent is extended or adjusted under 35 U.S.C. 154(b) by 851 days.

(21) Appl. No.: 11/656,241

(22) Filed: Jan. 22, 2007

(51) Int. Cl.
*H03K 17/78* (2006.01)
*H03F 3/08* (2006.01)

(52) U.S. Cl. ....... 250/214 SW; 250/214 LS; 250/214 A; 330/308

(58) Field of Classification Search .......... 250/551, 250/214 A, 214.1, 214 R, 214 SW, 214 LS, 250/214 LA, 214 AG, 214 C; 330/285, 10, 330/59, 238, 251, 110, 308; 327/105, 103, 327/307, 323, 543
See application file for complete search history.

(56) References Cited

U.S. PATENT DOCUMENTS

| | | | | |
|---|---|---|---|---|
| 4,369,371 | A | * | 1/1983 | Hara et al. ............. 250/551 |
| 5,008,525 | A | * | 4/1991 | Petronio ............... 250/214 C |
| 5,646,573 | A | * | 7/1997 | Bayruns et al. ......... 330/59 |

* cited by examiner

*Primary Examiner* — Georgia Y Epps
*Assistant Examiner* — Don Williams
(74) *Attorney, Agent, or Firm* — Matthew J. Evans; Daniel M. Barbieri

(57) ABSTRACT

In some embodiments, a microwave switch element may include one or more of the following features: (a) an electrically isolated input capable of receiving an input, (b) an amplifier electrically coupled to the input and to an active device, (c) a power source magnetically coupled to the amplifier.

18 Claims, 12 Drawing Sheets

MICROWAVE SWITCHING ELEMENT

FIELD OF THE INVENTION

Embodiments of the present invention relate to amplifiers. Particularly, embodiments of the present invention relate to switching elements. More particularly, embodiments of the present invention relate to microwave switching elements that are electrically isolated, self-biased, and optically sourced.

BACKGROUND OF THE INVENTION

Many high-power RF (radio frequency) and microwave applications include devices, such as switched power amplifiers, high-level mixers, TR (transmit receive) switches and series FET (field effect transistors) power amplifiers which require switching elements that are capable of handling high voltages and high currents (e.g., power amplifiers), switching at extremely high frequencies (e.g., microwave applications), and are isolated from surrounding structures & devices (e.g., the impedance increases).

As power and efficiency requirements increase, it becomes more difficult to switch devices in shorter times and still maintain isolation between devices and supplies. High power devices have more internal capacitance from terminal to terminal and also more external capacitance from terminals to ground. Eventually, for device circuits, switching elements such as those shown in FIGS. 1A-C, become unrealizable and ineffective.

Presently, there are various circuits (e.g., class D, E, F and S power amplifiers, GaAs ring mixers, optical data links) that have high efficiency and are fast switching. However, these circuits only operate at very low-power levels, such as low IP3 (third-order intercept point), so these current solutions are not helpful for larger power or microwave applications.

Presently, solutions to maximize switching times have been developed using multi-stage devices, such as Darlingtons pairs (e.g., piggy back transistor configuration), cascode FETs, series FETs, and MMICs (Monolithic Microwave Integrated Circuits), however isolation in the biasing schemes and input drive schemes limit performance.

Spatial combining of devices have been developed. Spatial combining of devices provides limited isolation between devices, associated losses and limited bandwidth.

Therefore, it may be desirable to provide a switching element that may operate with high voltage and currents, switches quickly, provides an isolated RF input and power supply and is also isolated from surrounding structures and devices.

SUMMARY OF THE INVENTION

In some embodiments, a switching element may include one or more of the following features: (a) an optically coupled input, (b) an amplifier electrically coupled to the input, (c) a power source coupled to the amplifier, and (d) an active device electrically coupled to the power source and the amplifier.

In some embodiments, a microwave switch element may include one or more of the following features: (a) an electrically isolated input capable of receiving an input, (b) an amplifier electrically coupled to the input and to an active device, (c) a power source magnetically coupled to the active device.

In some embodiments, a microwave switch element may include one or more of the following features: (a) an input to receive switching information, (b) an amplifier electrically coupled to the input to control a bias on a transistor and (c) a power source magnetically coupled to the amplifier.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Figure 1A:
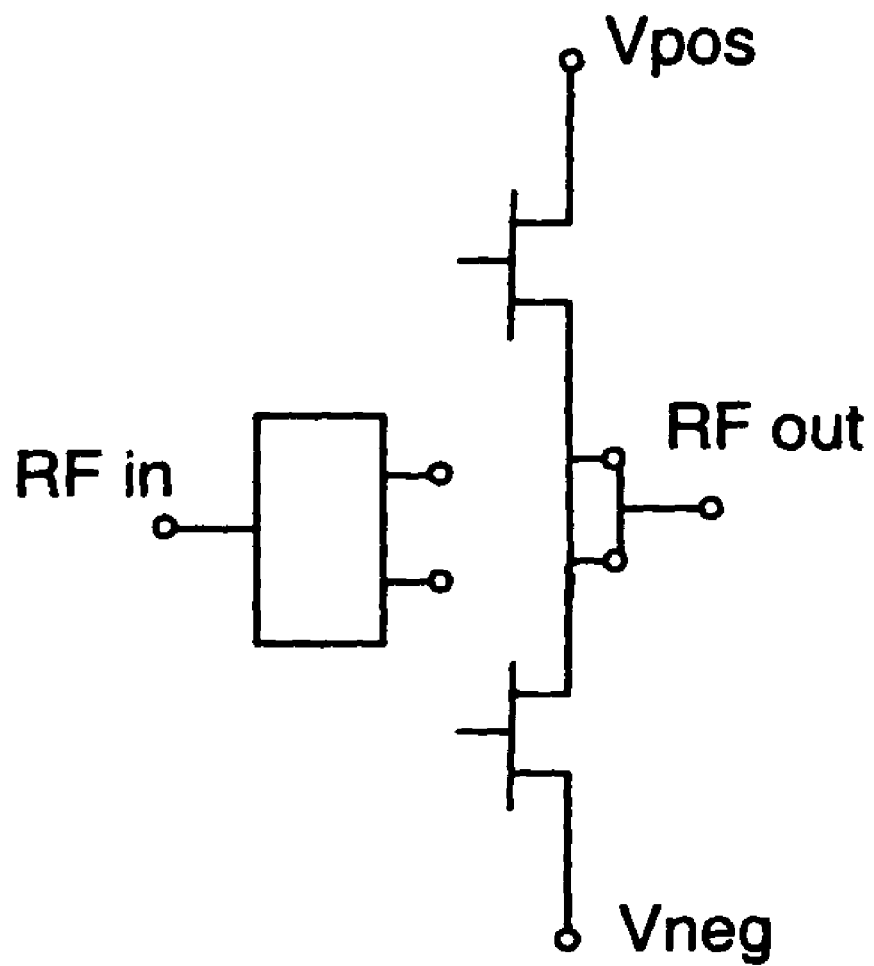
FIG. 1A is a class D amplifier.
Figure 1B:
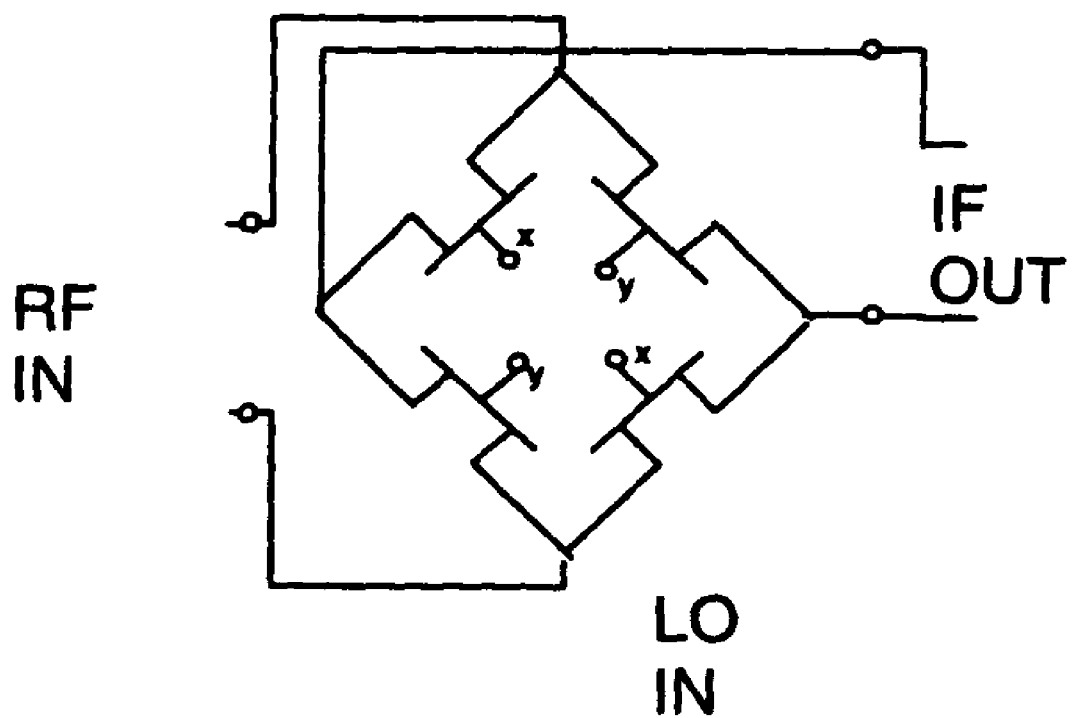
FIG. 1B is a (Double-Balanced), DB-mixer.
Figure 1C:
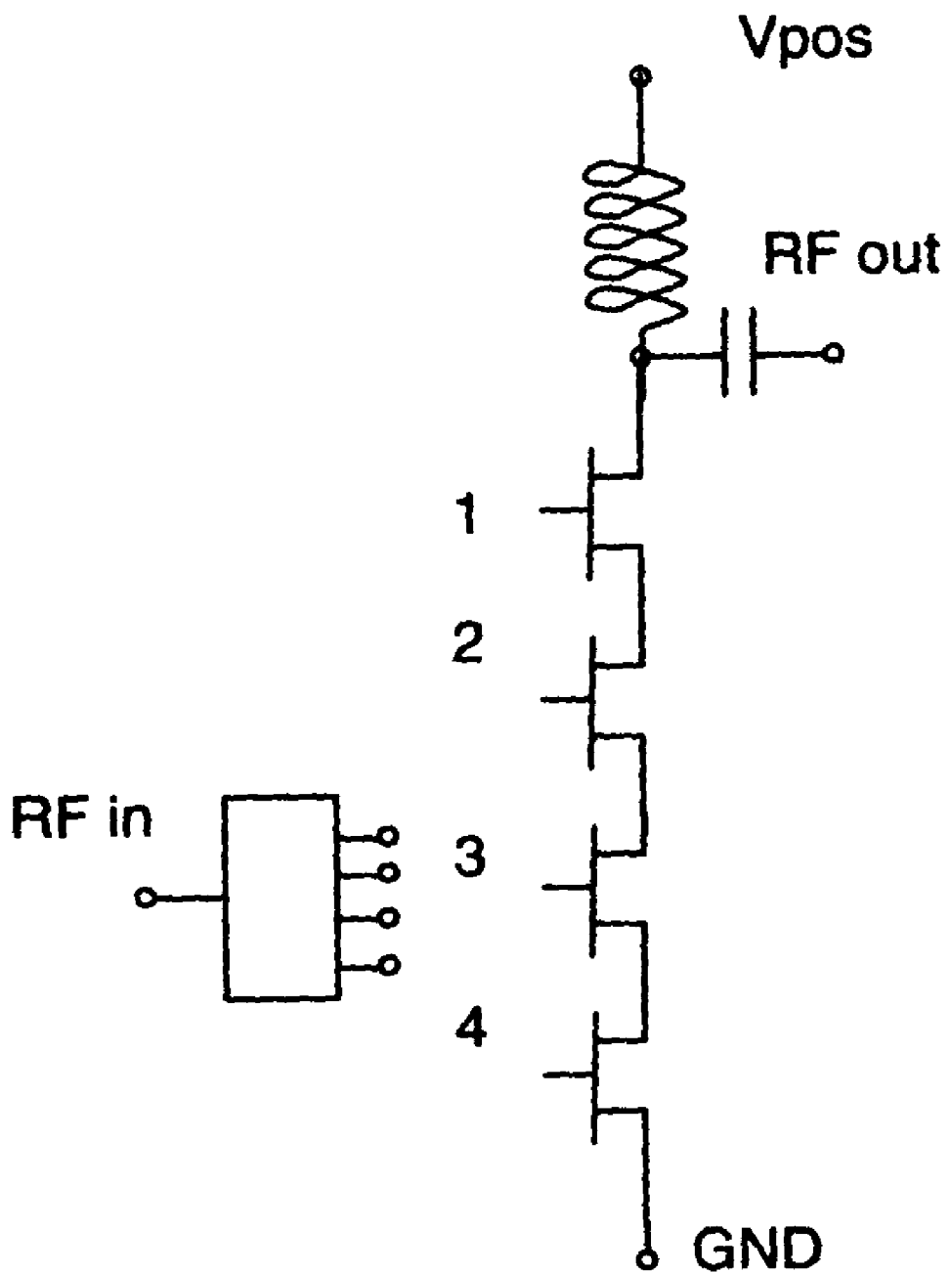
FIG. 1C is a series FET power amplifier.

Reference will now be made in detail to embodiments of the invention, examples of which are illustrated in the accompanying drawings.

The following discussion is presented to enable a person skilled in the art to make and use the present teachings. Various modifications to the illustrated embodiments will be readily apparent to those skilled in the art, and the generic principles herein may be applied to other embodiments and applications without departing from the present teachings. Thus, the present teachings are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of the present teachings. Skilled artisans will recognize the examples provided herein have many useful alternatives and fall within the scope of the present teachings.

Figure 2:
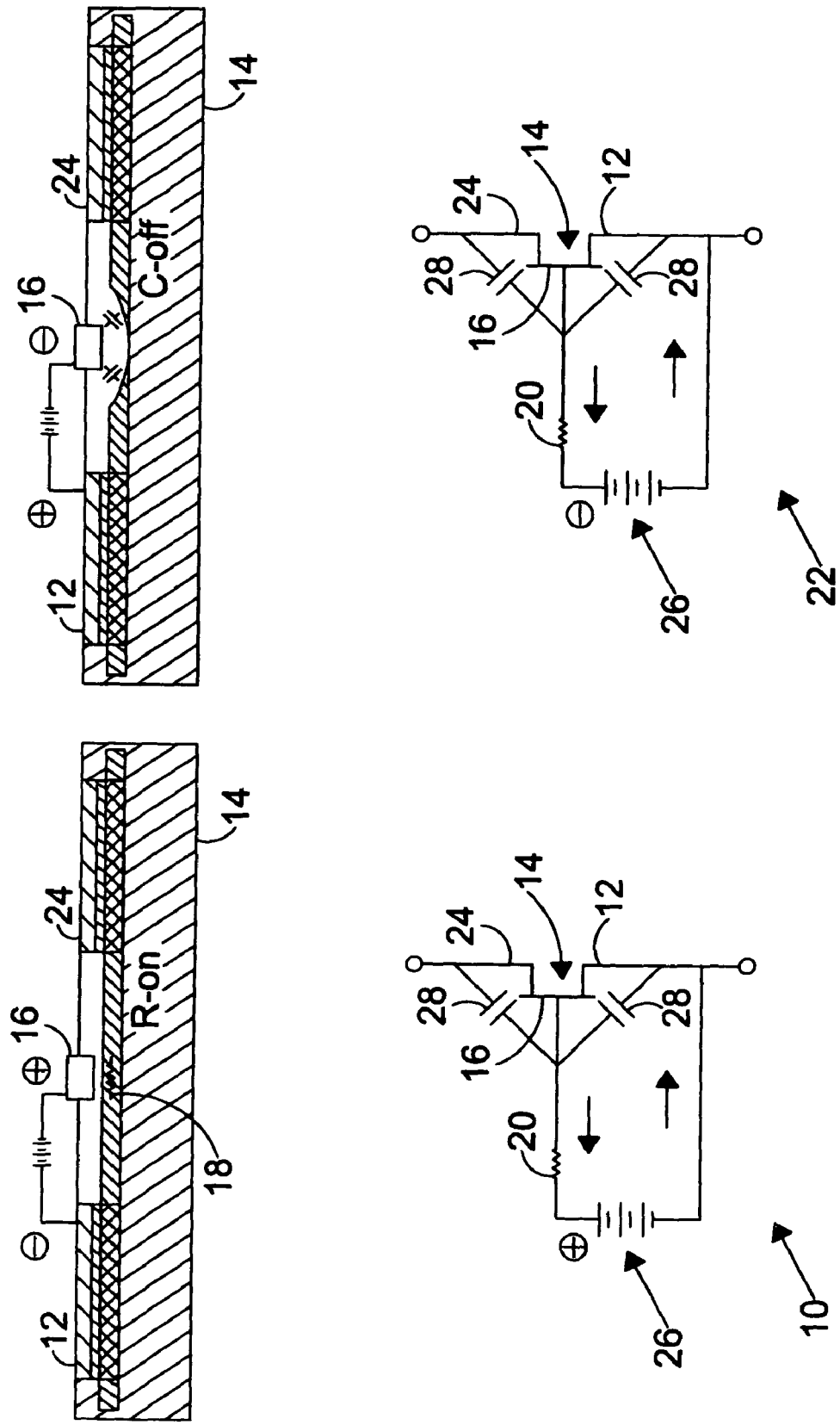
FIG. 2 shows two transistor circuits in an embodiment of the present invention.

With reference to FIG. 2, two transistor circuits in an embodiment of the present invention are shown. Switching circuit 10 represents a transistor circuit providing a negative bias on source 12 and a positive bias on gate 16 of transistor 14. Transistor or active device 14 may be most any transistor, but for purposes of this description transistor 14 is a Gallium nitride (GaN) transistor. In this biasing mode, channel 18 is not depleted and current may flow freely between drain 24 and source 12. The current necessary to charge the gate capacitors 28 to the appropriate voltage level flows through resistor 20. However, resistor 20 provides impedance which is undesired in a switching circuit as it decreases switching time.

Switching circuit 22 represents switching circuit 10 when a positive bias is placed on source 12 and a negative bias is placed on gate 16 of transistor 14. In this mode, channel 18 is depleted and no current may flow from source 12 to drain 24. Thus, in switching circuit 10, transistor 14 conducts current and may be said to be "on". In switching circuit 22, transistor 14 does not conduct current and may be said to be "off". When transistor 14 is "on", there is impedance due to resistor 20 and impedance between gate 16 and source 12. It is contemplated that reducing the impedance may improve (decrease) a switching element's switching time.

Figure 3:
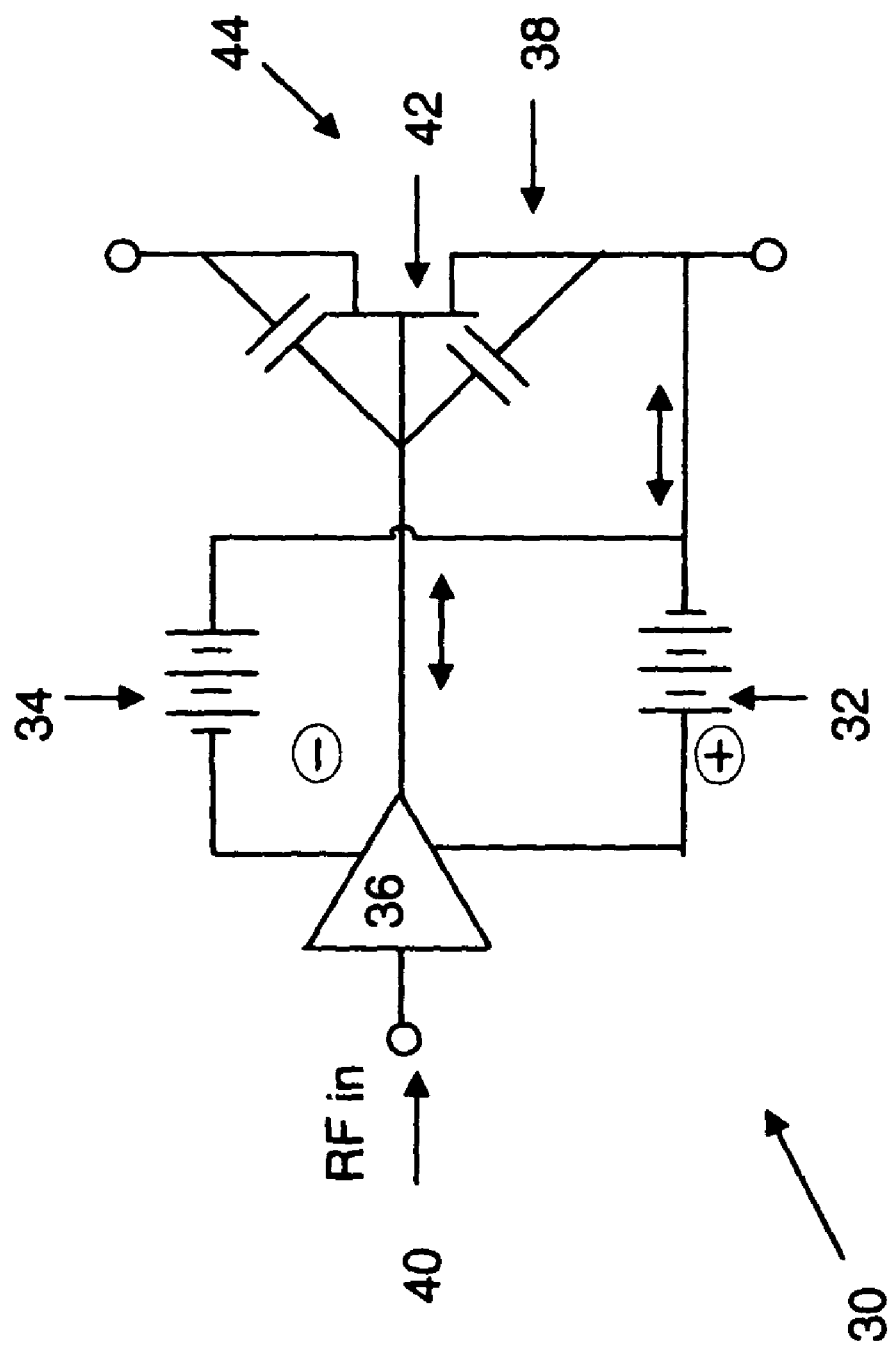
FIG. 3 shows a switching circuit in an embodiment of the present invention.

With reference to FIG. 3, a switching circuit in an embodiment of the present invention is shown. Switching circuit 30 may be substantially a combination of switching circuits 10 and 22. However, switching circuit 30 substantially reduces the impedance of circuit 30 by eliminating resistor 20 and replacing resistor 20 with power sources 32 and 34. The power sources, being voltage sources, are very low impedance elements. In this design, power sources 32 and 34 may be oppositely biased so that power source 32 positively biases operational amplifier (op-amp) 36 and negatively biases source 38. Likewise, power source 34 negatively biases op-amp 36 and positively biases source 38. Op-amp 36 receives an RF input 40 and provides an input to gate 42. RF input 40 may be a square-wave RF input instructing switching circuit 30 to turn off or on. Depending on RF input 40, gate 42 may be positively charged with respect to source 38 in which case switching circuit 30 may be on. In this scenario, RF input 40 may cause op-amp 36 to route a positive charge from power source 32 to gate 42 and a negative charge from power source 32 may be routed to source 38. Nothing may be received from power source 34 as its circuit may be considered open and thus no current may flow.

Depending on RF input 40, op-amp 36 may route a negative charge from power source 34 to gate 42 and a positive charge from power source 34 to source 38. This may cause transistor 44 to be in an off state as discussed in FIG. 2. Once again, no power may be felt from power source 32, as its circuit may be considered open at op-amp 36 and thus no current may flow.

Figure 4:
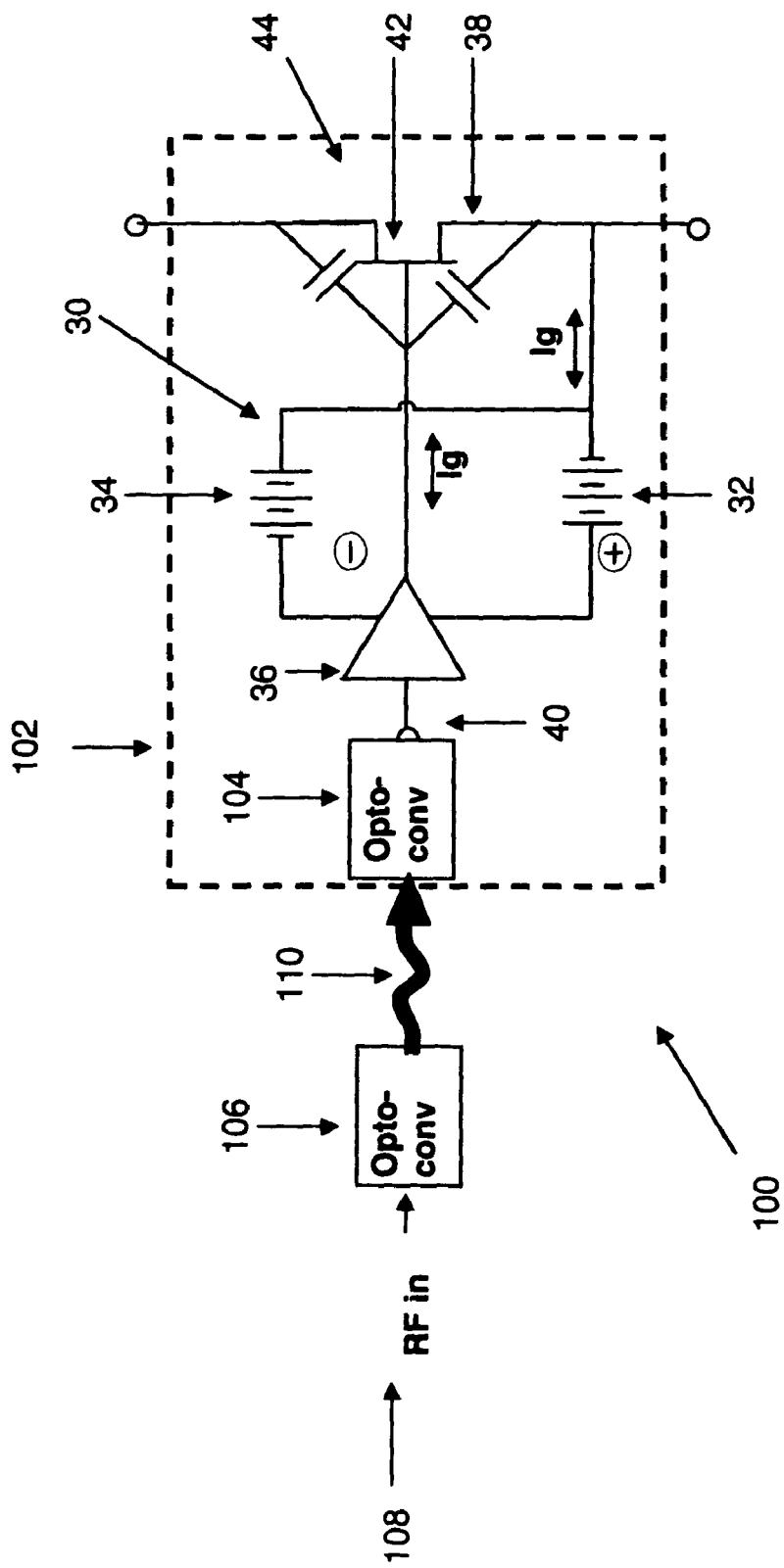
FIG. 4 shows a schematic view of an optically sourced isolated microwave switching element in an embodiment of the present invention.

With reference to FIG. 4, a schematic view of an optically sourced isolated microwave switching element in an embodiment of the present invention is shown. Optically sourced isolated microwave switching element (OSISE) 100 may be comprised of MMIC 102 that may house switching circuit 30 and an optical converter 104. An optical converter 106 may accept RF phasing information (discussed above) 108 that may be relayed via optical transmission 110 and inputted to optically coupled optical converter 104. Optical converters 106 and 104 create isolation between the incoming phasing information and the switching circuit, thus ensuring isolation for a switching element. Optical converters 106 and 104 may operate up to speeds of 100 GHz, which is helpful for microwave applications. Further it is noticed that OSISE 100 is completely isolated from the RF input except for the transfer of information between optical controllers 106 and 104, thus reducing any impedance between OSISE 100 and any outside circuits and increasing the switching speed.

Figure 5:
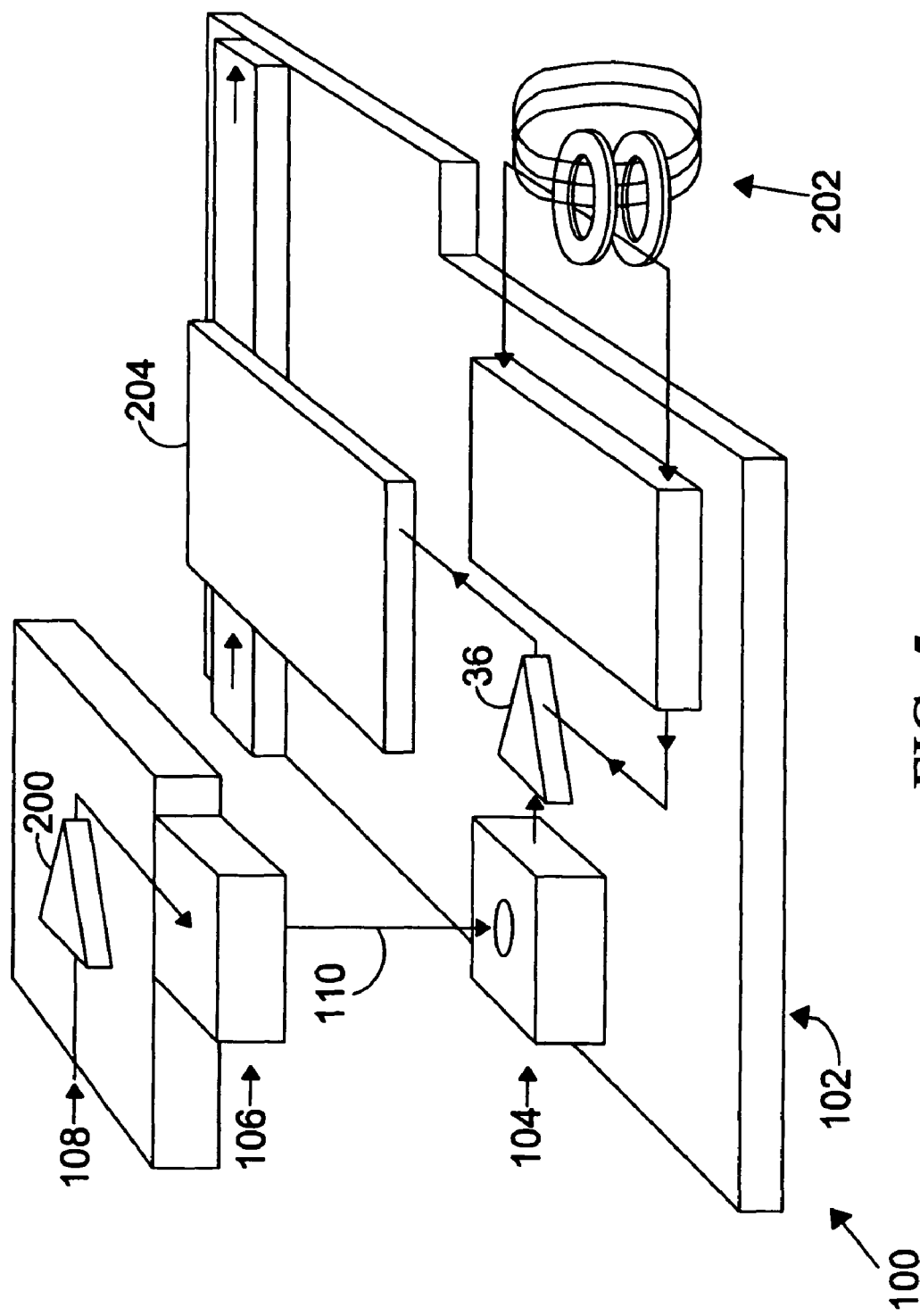
FIG. 5 shows a block diagram view of an optically sourced isolated microwave switching element in an embodiment of the present invention.

With reference to FIG. 5, a block diagram view of an optically sourced isolated microwave switching element in an embodiment of the present invention is shown. As discussed above, implementation of high-current, high-voltage switching elements at UHF (ultra high frequencies 300 MHz to 3 GHz) thru X-Band (7 to 12.5 GHz) have been very difficult in the past due to the lack of isolation between switch elements. The optically sourced isolated microwave switching element may isolate the switching elements using optical coupling (LED [light emitting diode] to PVD [photovoltaic diode]) for the RF coupling and, in this embodiment, magnetic coupling to generate the DC biasing of the active device such as a transistor. This provides an improved switch with switching frequencies from DC to upper frequencies only limited by the speed of the optical coupling, which is currently approaching 100 GHz., yet completely decoupled from other nearby devices.

LED 106 is inputted with RF phasing information 108 which is routed through an LED driver 200 where the signal is amplified. RF phasing information 108 may refer to the data that will instruct OSISE 100 when to turn on and turn off. Thus it controls the switching. After exiting LED driver 200, RF phasing information 108 goes to LED 106 where the information is converted to light. Optical transmission 110 is sent to PVD 104 located on MMIC 102 on OSISE. Optical transmission 110 is then converted to RF by PVD 104 and sent onto op-amp 36. Op-amp 36 is biased by power source 202. It is noted that power source 202 is shown as being inductively coupled to MMIC 102, ie., magnetic energy is generated in the external circuitry at a lower frequency and transmitted to the receiving coils on the OSISE. However, most any type of coupling may be implemented, such as optical coupling, at another wavelength, without departing from the spirit of the invention. RF 108 may be sent from op-amp 36 to switching circuit 204 that will either turn OSISE 100 off or on. OSISE 100 has isolated switching element 204 and thus provides an isolated switching element that may handle high frequencies and large amounts of voltage and current and still switch quickly.

Figure 6:
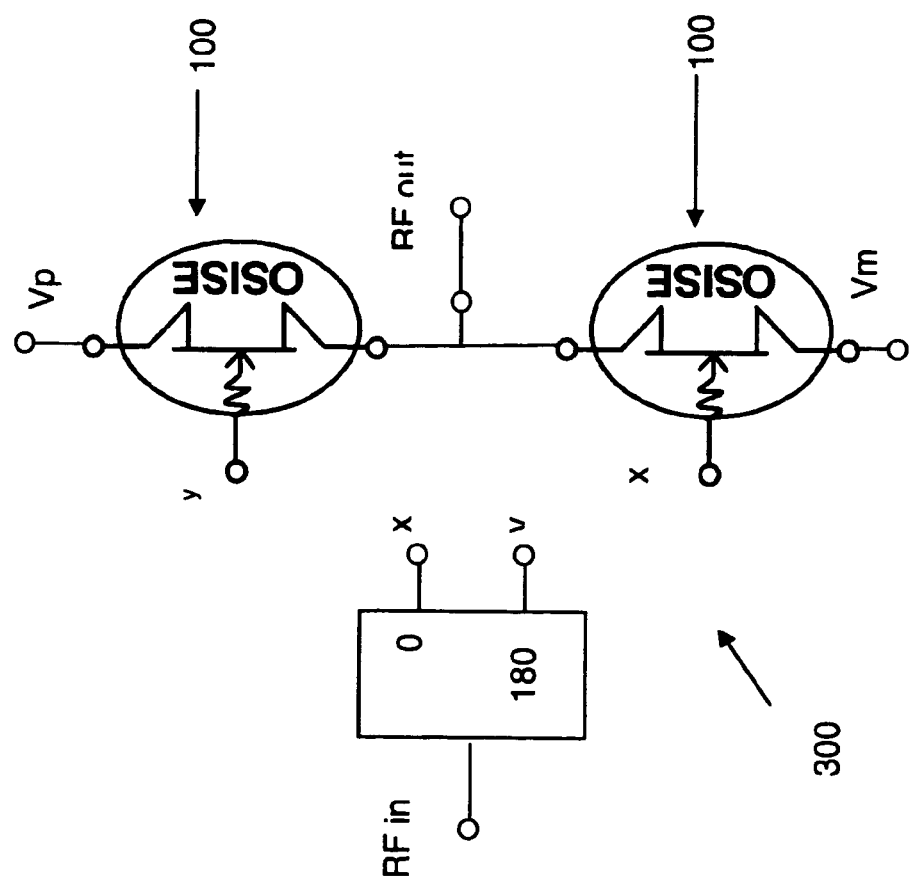
FIG. 6 shows a schematic diagram of a TR switch utilizing an optically sourced isolated microwave switching element in an embodiment of the present invention.
Figure 7:
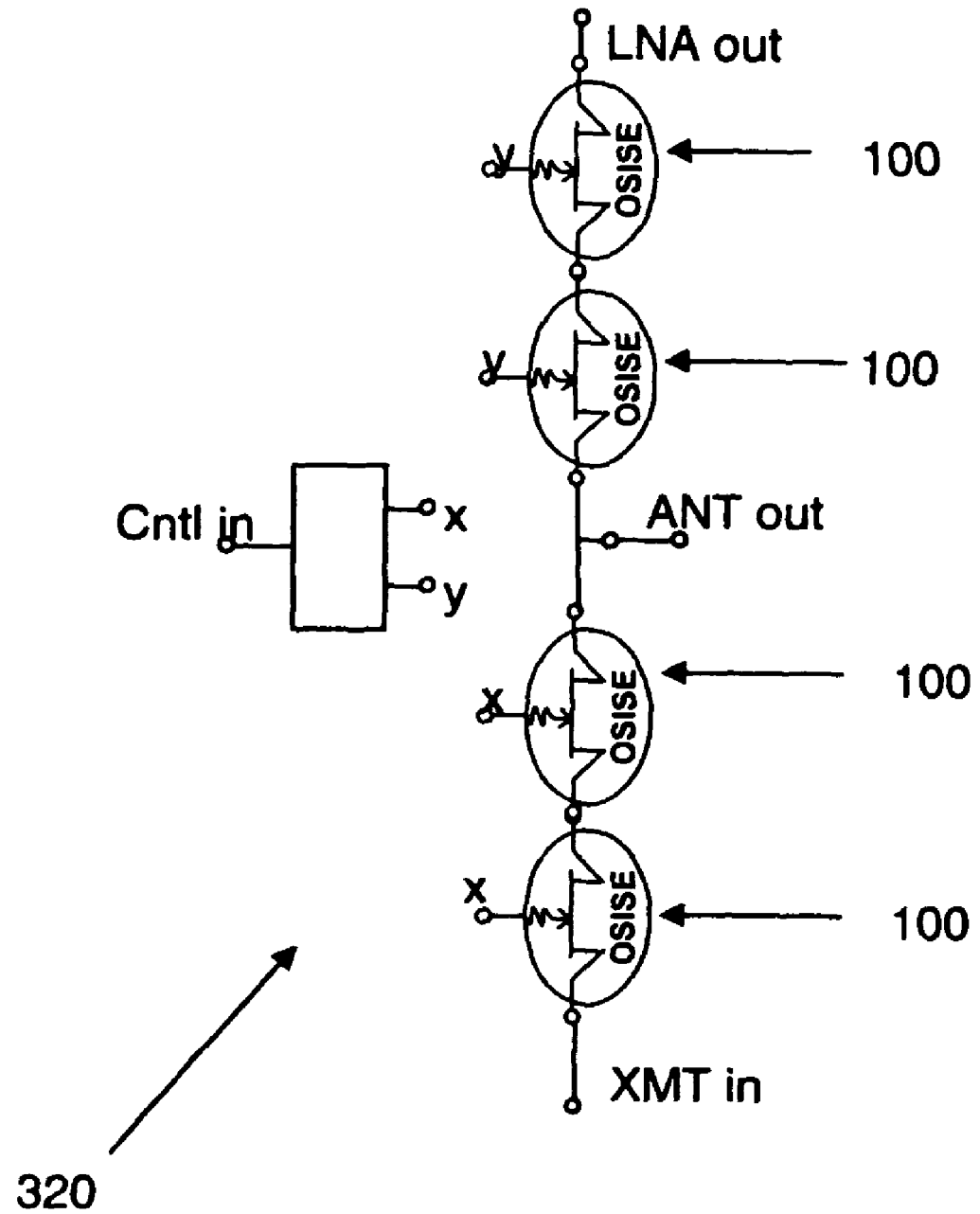
FIG. 7 shows a schematic diagram of a high-power series TR, (transmit/receive) switch utilizing an optically sourced isolated microwave switching element in an embodiment of the present invention.

With reference to FIGS. 6 and 7, a schematic diagram of switches utilizing optically sourced isolated microwave switching elements in an embodiment of the present invention is shown. FIG. 6 discloses using OSISE 100 in a basic Class D amplifier stage 300. One topology of a Class-D amplifier implements with an N-type device on the negative supply and a P-type device on the positive supply. P-type devices are generally slower and have lower operating voltages than the equivalent N-type device and, in addition the P-type device is difficult to switch on and off due to its potential around the positive voltage rail. Using an OSISE 100 in a Class-D amplifier provides crisp switching to both the positive and negative rail which in turn will produce better efficiencies than are possible with today's topologies. Class-D amplifiers may also be designed using a 3-way transformer coupled to the output of two N-type devices. Transformers have limited bandwidth, insertion loss and are usually large and heavy. An OSISE amplifier offers a high efficiency in a compact, low weight package.

FIG. 7 discloses using OSISE 100 in a high-power series transmit/receive switch 320. Using OSISEs allows switching elements to be stacked, two in each leg, to give the T/R switch a high voltage capability and at the same time providing a straight forward, non-interactive method for switching the elements from entirely on to entirely off at maximum RF voltage and current levels without concerns about sufficient biasing for either state. Switching speeds may also be dramatically increased by using the OSISEs instead of using conventional large impedances in the gates.

Figure 8:
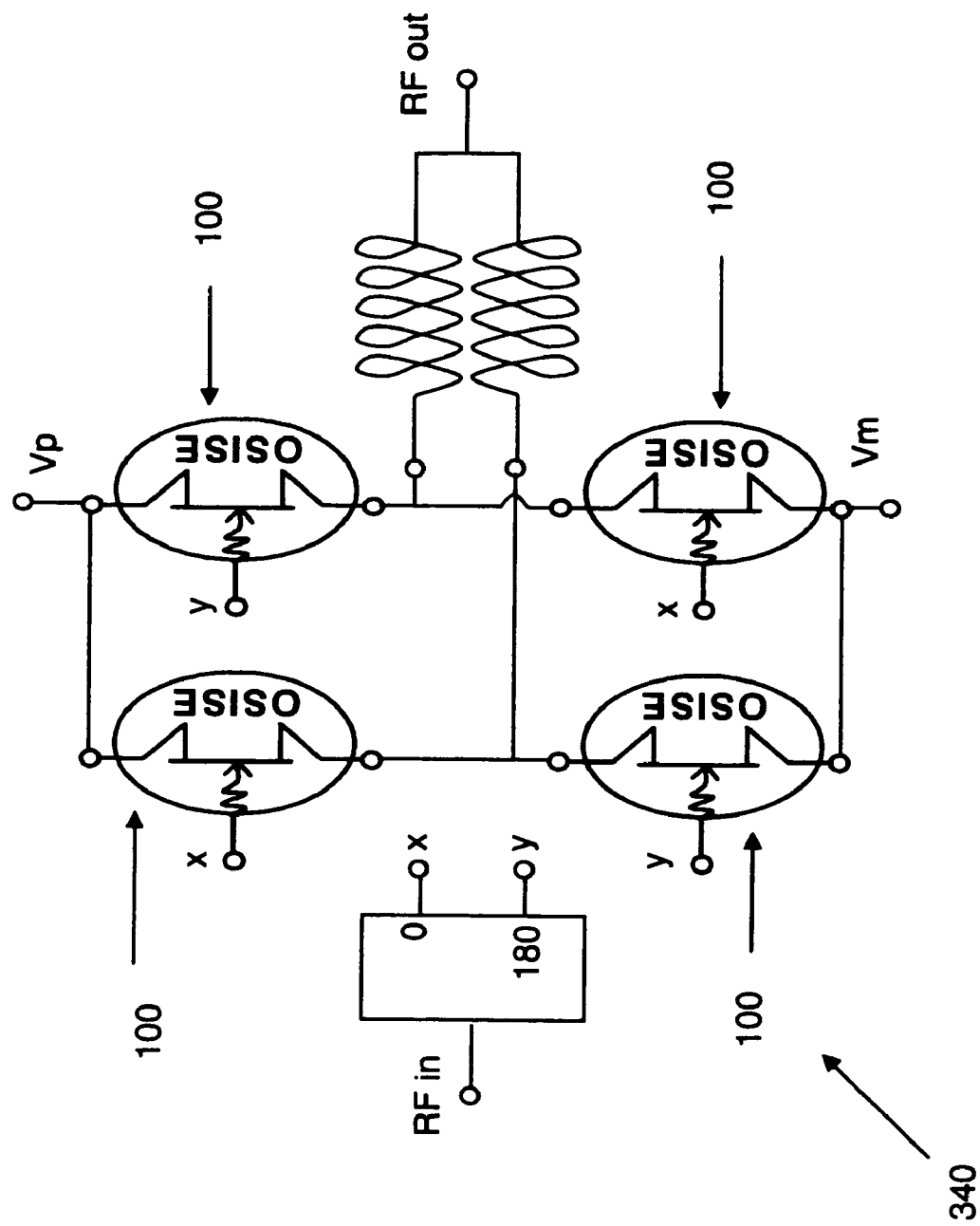
FIG. 8 shows a balanced class-D amplifier utilizing an optically sourced isolated microwave switching element in an embodiment of the present invention.
Figure 9:
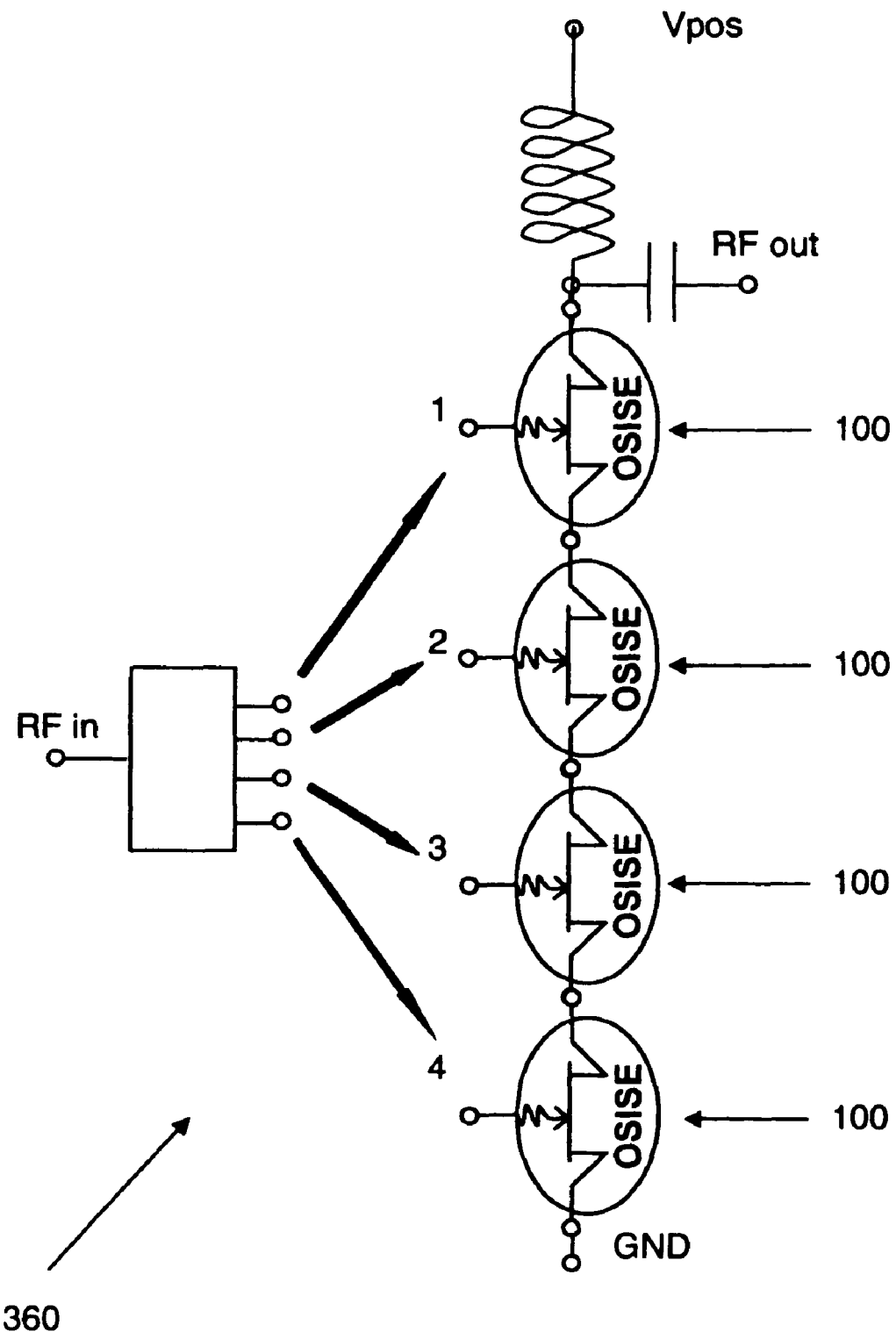
FIG. 9 shows a series FET amplifier utilizing an optically sourced isolated microwave switching element in an embodiment of the present invention.

OSISE 100 may be used in a class-D single ended switch (such as 320 in FIG. 7), class-D balanced switch 340 (FIG. 8), and a switch-mode power amplifier switch 360 (FIG. 9) all of which may be utilized in high power. For example, output power of hundreds of watts to several kilowatts is achievable using wide-bandwidth, high-efficiency RF and microwave amplifiers. OSISE 100 may provide isolation between all switch devices, between stacked switching devices, and ground. This enables improved switch behavior of each OSISE 100 which is independent of other switching elements (OSISE or not) and allows power amplifier devices to be efficiently stacked and operated in a series configuration or operated as switches tied to independent voltage supply lines.

Figure 10:
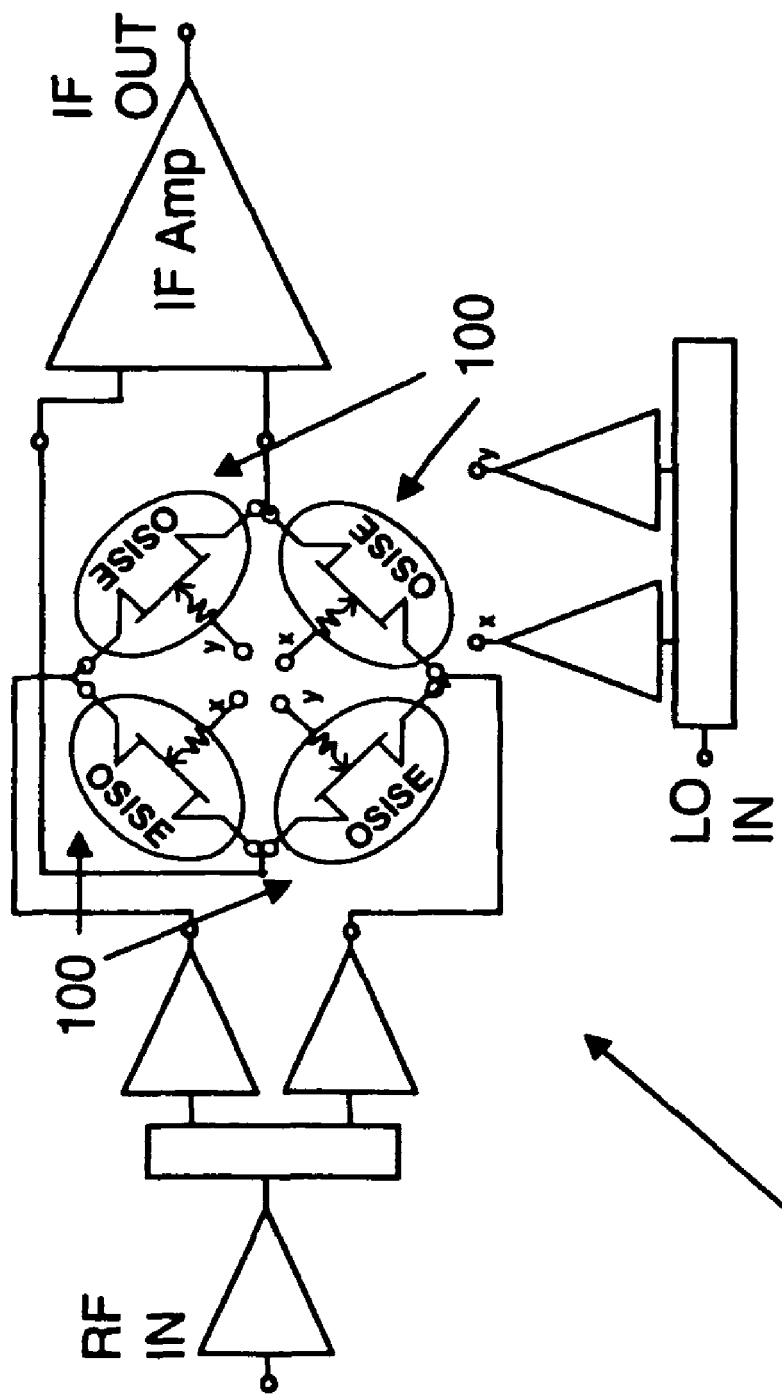
FIG. 10 shows a frequency mixer utilizing an optically sourced isolated microwave switching element in an embodiment of the present invention.

With reference to FIG. 10, a frequency mixer 380 utilizing an optically sourced isolated microwave switching element in an embodiment of the present invention is shown. Single and doubly balanced mixers may be implemented using OSISE optically coupled, isolated, switching elements, instead of conventional switching devices. OSISE allows true, broadband, high-speed switching that is difficult or unachievable using standard device drivers and also provides the device-to-device isolation required in many mixing applications. The self-biasing feature allows complete electrical isolation of the switching elements in the mixer.

OSISE allows for new mixers with broadband and high level conversion performance which may accommodate higher input powers, eliminate large and costly RF filtering, reduce limiter requirements and decrease susceptibility to jamming signals. These ultra-linear, efficient mixers may promote a reduction in size, weight, power consumption and cost (SWAP+C)

It is believed that the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. Features of any of the variously described embodiments may be used in other embodiments. The form herein before described being merely an explanatory embodiment thereof. It is the intention of the following claims to encompass and include such changes.

What is claimed is:

1. A switching element, comprising:
   an optical input;
   an amplifier electrically coupled to the optical input;
   a power source magnetically coupled to the amplifier, wherein said amplifier is directly coupled to receiving coils, the receiving coils being inductively coupled with the power source; and
   an active device electrically coupled to the amplifier.

2. The switching element of claim 1, wherein the optical input receives an optical transmission.

3. The switching element of claim 2, wherein the optical transmission is RF phasing information.

4. The switching element of claim 1, wherein the optical input isolates the switching element from other switch elements, ground, and other power supplies.

5. The switching element of claim 1, wherein the power source is isolated from the switching element.

6. The switching element of claim 1, wherein the optical input is a photovoltaic diode.

7. A switch, comprising:
   an electrically isolated input capable of receiving an input;
   an amplifier electrically coupled to the electrically isolated input;
   an active device electrically coupled to the amplifier; and
   a power source magnetically coupled to the amplifier, wherein said amplifier is directly coupled to receiving coils, the receiving coils being inductively coupled with the power source.

8. The switch of claim 7, wherein the power source provides a DC bias for the active device.

9. The switch of claim 7, wherein the electrically isolated input is an optical input.

10. The switch of claim 9, wherein the optical input receives RF transmissions containing switching information from a LED.

11. A switch, comprising:
    an input to receive switching information;
    an amplifier electrically coupled to the input;
    a transistor electrically coupled to said amplifier; a bias of said transistor being controlled by said amplifier; and
    a power source magnetically coupled to the amplifier, wherein said amplifier is directly coupled to receiving coils, the receiving coils being inductively coupled with the power source.

12. The switch of claim 11, wherein the input isolates the switch from other switch elements, ground, and other power supplies.

13. The switch of claim 11, wherein the power source isolates the switch.

14. The switch of claim 11, wherein the power source provides a DC bias for the transistor.

15. The switch of claim 11, wherein the input is an optical input.

16. The switch of claim 15, wherein the optical input is a photovoltaic diode.

17. The switch of claim 16, wherein the photovoltaic diode receives an optical transmission containing switching information.

18. The switch of claim 17, wherein the switching information is received at a rate up to 100 GHz.

* * * * *